United States Patent [19]

Matsunaga

[11] Patent Number: 5,909,374
[45] Date of Patent: Jun. 1, 1999

[54] SYSTEM AND METHOD FOR VERIFYING LOGIC CIRCUIT BASED ON SIGNAL LINE SET AFFECTING INTERNAL SIGNAL

[75] Inventor: Yusuke Matsunaga, Kawasaki, Japan

[73] Assignee: Fujitsu Limited, Kawasaki, Japan

[21] Appl. No.: 08/692,096

[22] Filed: Aug. 7, 1996

[30] Foreign Application Priority Data

Oct. 17, 1995 [JP] Japan ................................. 7-268815

[51] Int. Cl.$^6$ .................................................. G06F 17/00
[52] U.S. Cl. ........................... 364/488; 364/489; 364/490
[58] Field of Search ..................................... 364/488–491

[56] References Cited

U.S. PATENT DOCUMENTS 5,243,538  9/1993  Okuzawa et al. ........................ 364/489

OTHER PUBLICATIONS

W. Kunz, et al., "Recursive Learning: A new Implication Technique for Efficient Solutions to CAD Problems—Test, Verification, and Optimization"; (1994); pp. 1143–1158.
S.M. Reddy, et al., "Novel Verification Framework Combining Structural and OBDD Methods in a Synthesis Environment"; (1995); pp. 414–419.
J. Jain, et al., "Advanced Verification techniques Based on Learning"; (1995); pp. 420–426.
C. Leonard Berman, et al., "Functional Comparison of Logic Designs for VLSI Circuits"; (1989); pp. 456–459.
Cerny et al "Tautology Checking Using Cross–Controllability and Cross–Observability Relations," IEEE, pp. 34–37, Nov. 1990.
Mukherjee et al "Verifu1: Verification Using Functional Learning," IEEE, pp. 444–448, Mar. 1995.
Jain et al "IBDDs: An Efficient Functional Representation for Digital Circuits," IEEE, pp. 440–446, Mar. 1992.
Nakaoka et al "A Verification Algorithm for Logic Circuits with Internal Variables," IEEE, pp. 1920–1923, 1995.
Mukherjee et al "On More Efficient Combinational ATPG Uisng Functional Learning," IEEE, pp. 107–110, 1995.
Mukherjee et al "Functional Learning: A New Approach to Learning in Digital Circuits," IEEE, pp. 122–127, Apr. 1994.

*Primary Examiner*—Kevin J. Teska
*Assistant Examiner*—Vuthe Siek
*Attorney, Agent, or Firm*—Staas & Halsey, LLP

[57] ABSTRACT

A logic circuit verifying system selects independent signal lines which are positioned in an input terminal side and affects both of two internal signal lines extracted from two combinational logic circuits. The logical functions of the two internal signal lines are generated using the selected signal lines as a pseudo-input. If the logical functions match, it is determined that the two internal signal lines are equivalent to each other. According to the information about the equivalent signal lines, the equivalence of the two logic circuits can be efficiently verified.

14 Claims, 13 Drawing Sheets

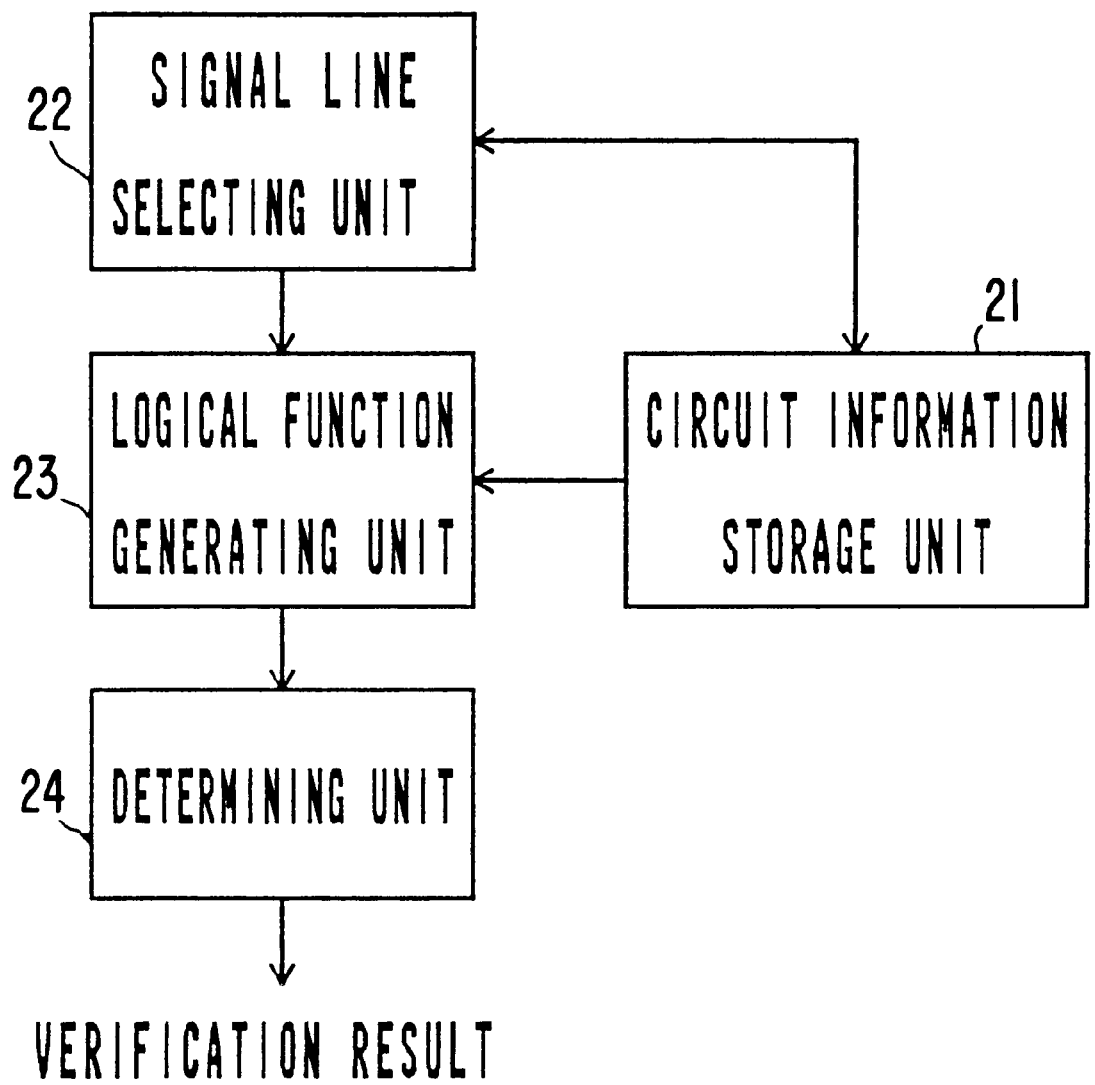
F I G. 2A

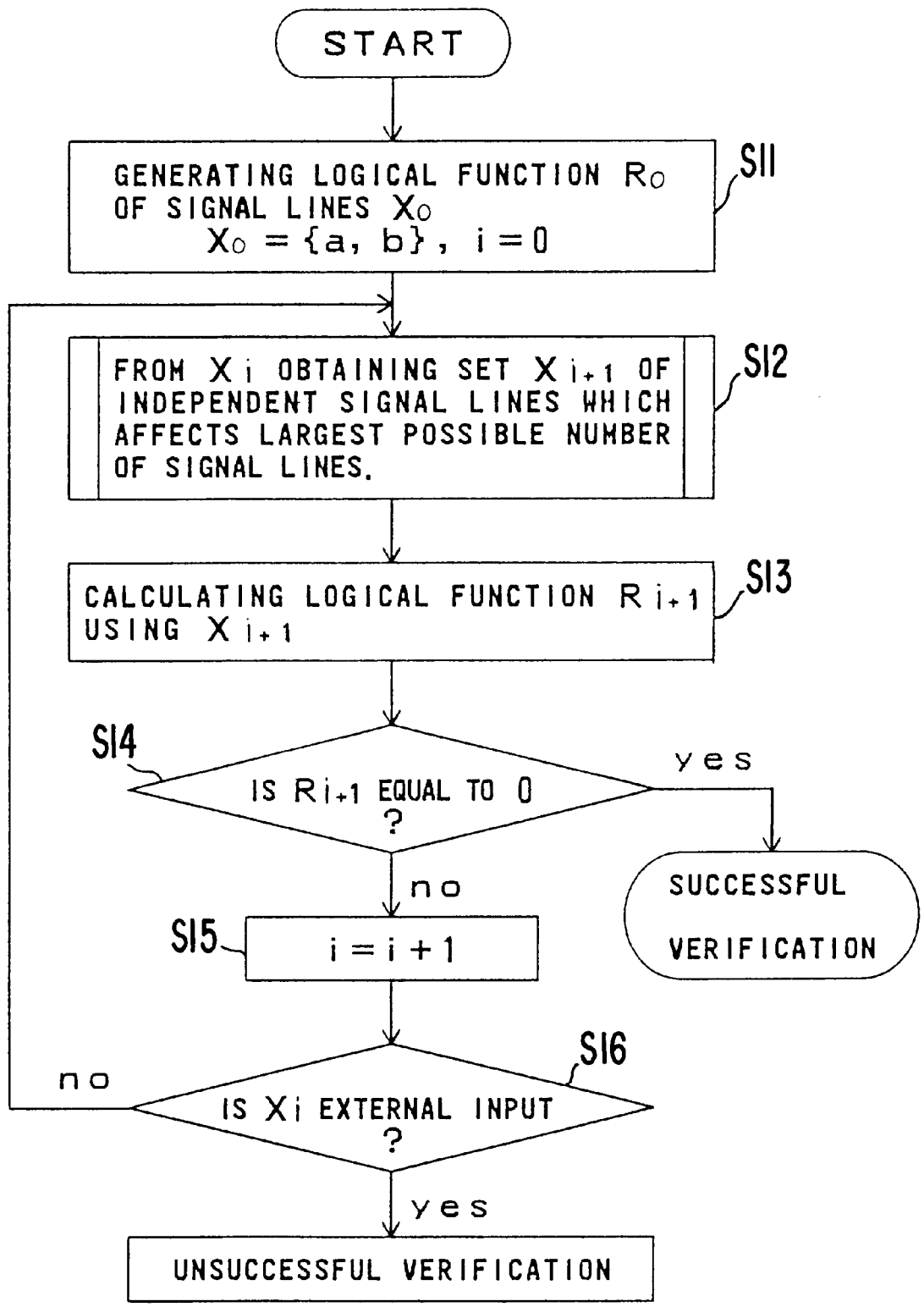
F I G. 5

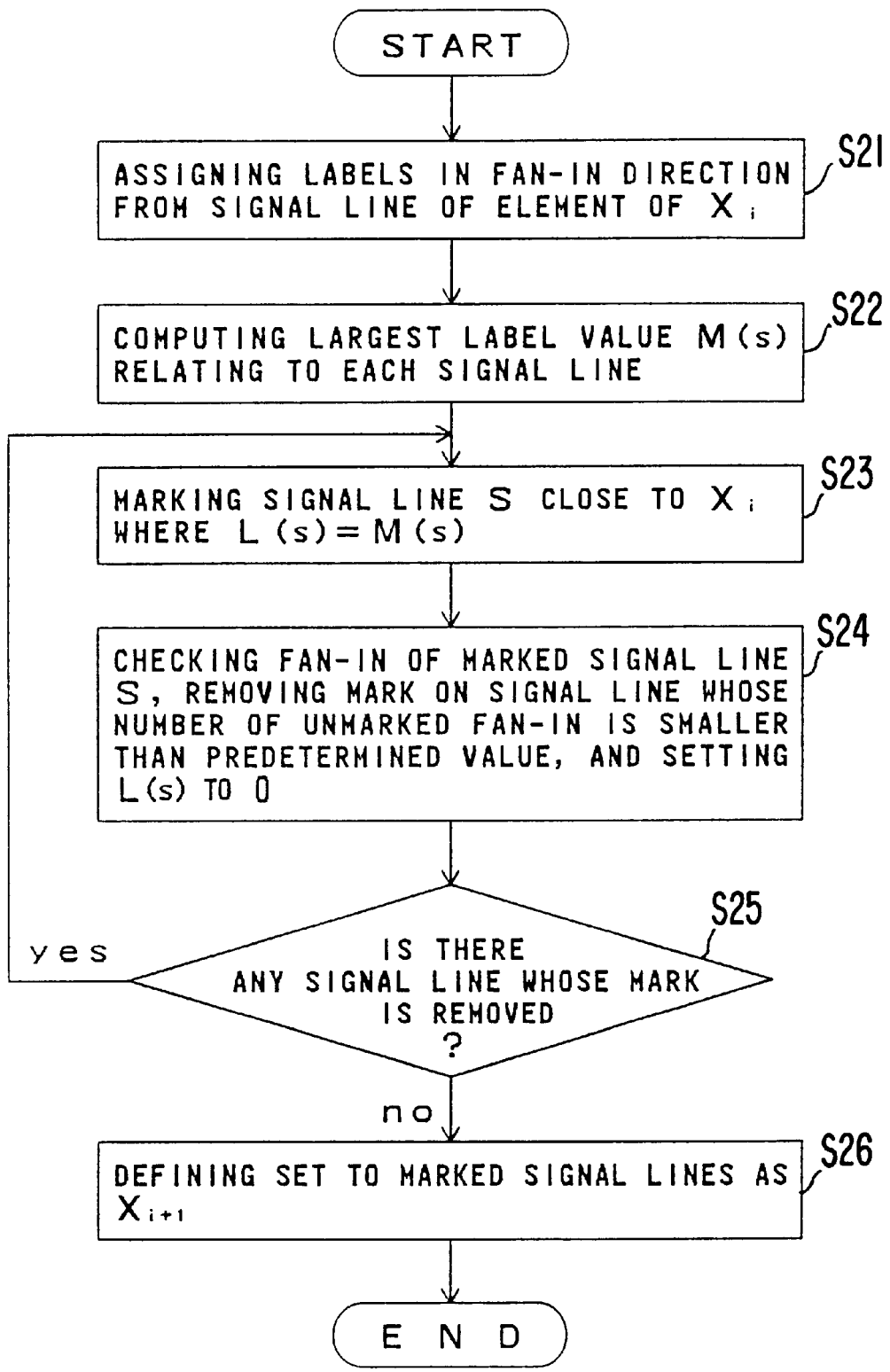
F I G. 6

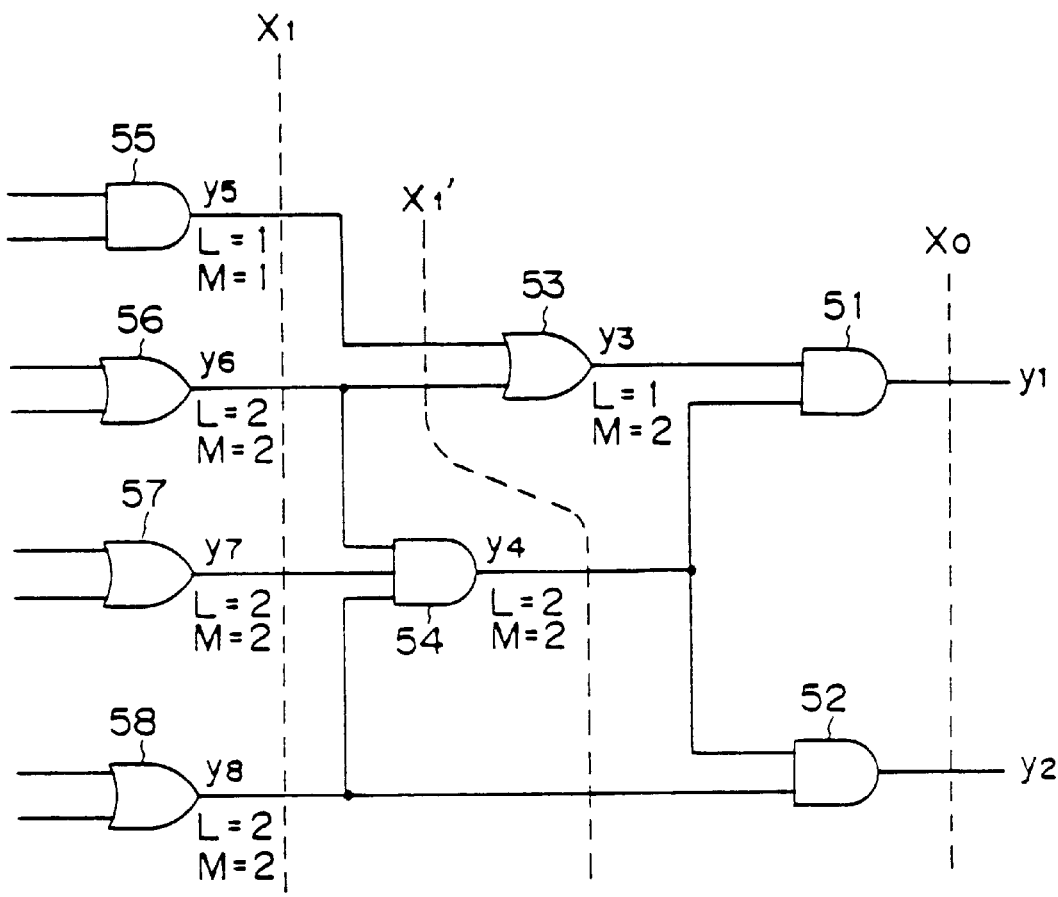
F I G. 11

SYSTEM AND METHOD FOR VERIFYING LOGIC CIRCUIT BASED ON SIGNAL LINE SET AFFECTING INTERNAL SIGNAL

BACKGROUND OF THE INVENTION

1. Field of the Invention

The present invention relates to a logic circuit verifying system and method for checking whether or not two combinational logic circuits having no internal states are equivalent with each other.

2. Description of the Related Art

When a logic circuit is designed, the configuration of the circuit is normally amended without changing the function of the originally designed circuit to satisfactorily meet the restrictive conditions relating to the number of gates, delay time, etc. Such a circuit amendment can be automatically made by a computer program, but is normally performed manually by its skilled designer. At this time, it is necessary to verify the functional equivalence of the circuits before and after the amendment to prevent the functions of the circuit from being changed by a mis-amendment. Thus, it is very important in circuit designing to verify the equivalence of logic circuits.

One equivalence verifying method is followed by applying the same input pattern to two circuits, performing a logical simulation, and checking whether or not the same output value is obtained from the two circuits. However, in this method, the equivalence is not verified unless all input patterns are checked. Assuming that the number of inputs external to the circuit is n, the number of patterns required for verification is $2^n$. If the value n refers to several tens, it is almost impossible to simulate all patterns.

Another equivalence verifying method is followed by representing a logical function of an output external to the circuit as data structure, referred to as a dichotomizing decision graph, and checking whether or not the dichotomizing graphs of the outputs external to the two circuits are similar to each other. However, the dichotomizing decision graph may not be prepared, using this method, by using the explosion of the nodal points on the graph, depending on the scale and properties of the circuit.

On the other hand, Kunz and others have suggested a method for verifying the equivalence through an indirect implication referred to as a recursive learning (W. Kunz and D. K. Pradhan, "Recursive learning: A new implication technique for efficient solutions to CAD problems—test, verification, and optimization.", in IEEE Trans. on Computer-aided Design of Integrated Circuits and systems, Vol, 13, No. 9, pages 1143–1157, September, 1994, Hannibal). Reddy and others have suggested a combination of the recursive learning and the dichotomizing decision graph (S. M. Reddy, W. Kunz and D. K. Pradhan, "Novel Verification Framework Combining Structural and OBDD Methods in a Synthesis Environment", in Proc. 32nd Design Automation conf., pp. 414–419, June 1995).

According to Reddy and others, a set of equivalent internal signal lines in two circuits is obtained using the recursive learning, and an equivalent internal signal line closest to the external output is defined as a pseudo-input. Using the pseudo-input, the logical functions of the external outputs are generated and compared between the two corresponding external outputs. In this method, the explosion of the number of nodal points on the dichotomizing decision graph can be suppressed by generating the logical functions with the internal signal lines of the circuits applied as pseudo-inputs. When the two compared logical functions are equal to each other, the equivalence of the circuits is verified, but the equivalence is not necessarily verified if the logical functions are not equal to each other.

FIG. 1A shows an example of equivalent circuits having different structures. In FIG. 1A, the left circuit comprises a NAND gate 1, AND gates 2 and 3, and OR gate 4, and generates an output signal x1 from input signals A, B, and C. The right circuit comprises a NAND gate 5, AND gates 6 and 7, and XOR (exclusive or) gate 8, and generates an output signal x2 from input signals A, B, and C. These two circuits are different in element of the output stages, but are equivalent in entire circuit. When the equivalence of circuits is verified by the method of Reddy and others, the input signals s1 and t1 of the OR gate 4 and the input signals s2 and t2 of the XOR gate 8 are used as pseudo-inputs of a logical function. However, the logical function of the external output x1 generated by inputting s1 and t1 is quite different from the logical function of the external output x2 generated by inputting s2 and t2.

In this case, it should be furthermore checked whether or not the set of the internal signal lines which are used as the pseudo-input can be values that generate different external outputs. Reddy and others temporarily assign 0 or 1 to the internal signal lines, and determines that the circuits are not equivalent if all assignments are performed without inconsistency and the external outputs are different from each other. It is determined that the circuits are equivalent if assigning values to make different external outputs generates inconsistency.

Jain and others also suggests an equivalence verifying method similar to that suggested by Reddy and others (J. Jain, R. Mukherjerr and M. Fujita, "Advanced Verification Techniques Based on Learning", in Proc. 32nd Design automation conf., pp. 420–426, June 1995). The method suggested by Jain and others also generates logical functions of two external outputs with the equivalent internal signal lines closest to the external outputs used as pseudo-inputs, and determines that the circuits are equivalent if the generated functions are equal to each other. If they are not equal to each other, it is checked whether or not a set of internal signal lines applied as a pseudo-input can refer to values to generate different external outputs. In the verification, a set of signal lines closer to the external inputs than the internal signal lines used as pseudo-inputs is selected and defined as a new pseudo input. Using the original pseudo-input signal lines as a pseudo-output, the logical function of the output is generated, and it is checked whether or not an input which causes different external outputs exists.

According to the methods of Reddy and Jain, the relationship between internal signal lines is first obtained by a relatively high-speed, but not definite determining method, and then an equivalence verification is performed between the internal signal lines closer to output terminals or on external outputs according to the obtained relationship. However, as shown in FIG. 1B, when two circuits, which are equivalent in function of external output but different in configuration closer to external inputs are verified, those methods are not necessarily effective.

In FIG. 1B, one logical circuit comprises combinational circuits 9 and 10, and the other logical circuit comprises combinational circuits 11 and 12. The combinational circuits 9 and 11 are equivalent in function, but different in structure. The combinational circuits 10 and 12 have the same structure. With these circuits, since the combinational circuits 9 and 11, which are close to an external input, are different from each other in the first high-speed determining method, there may be no equivalent internal signal lines between two logic circuits. In this case, it may require a long time to determine the equivalence of external outputs, or a process may not be performed within a practical time.

For example, if internal signal lines $i1, i2, \ldots, iN$ are equivalent to internal signal lines $j1, j2, \ldots, jN$ in FIG. 1B, it is determined that all signal lines contained in the combinational circuits 10 and 12 are equivalent because the partial circuits at the output terminals of these signal lines have the same structure. However, in the recursive learning used in the method suggested by Reddy, etc., $2^m$ cases can be assumed based on the number m of signal lines to which values are assigned, and a practical process cannot be performed if m refers to several tens. Therefore, if a larger-scale circuit is to be verified, the number of cases should be limited. As a result, there is the possibility of failing to recognize that the internal signal lines $i1, i2, \ldots, iN$ are equivalent to the internal signal lines $j1, j2, \ldots, jN$. At this time, the internal signal lines in the combinational circuits 9 and 11 are to be checked. However, since these circuits are different in structure, it is hard to detect equivalent internal signal lines.

Furthermore, according to the functional learning suggested by Jain and others, a new set of internal signal lines should be selected if a comparison is made after generating a logical function using a set of internal signal lines to be first verified as a pseudo-input. However, it is not practically indicated which internal signal line is traced back to generate the logical function. If an internal signal line is selected through a number of attempts, there is the possibility of failing to recognize that the internal signal lines $i1, i2, \ldots, iN$ are equivalent to the internal signal lines $j1, j2, \ldots, jN$, thereby causing the problem similar to that of the recursive learning.

Thus, the conventional equivalence verifying methods cannot completely verify the equivalence of the internal signal lines, and cannot be used as methods for practical use.

SUMMARY OF THE INVENTION

The present invention provides a system and a method for efficiently verifying the equivalence in function of two combinational logic circuits.

The logic circuit verifying system according to the present invention comprises a circuit information storage unit, a signal line selecting unit, a logical function generating unit, and a determining unit.

The circuit information storage unit stores circuit information relating to a plurality of logic elements forming the above described two logic circuits, and also stores the first set of the signal lines for use in verification. The circuit information refers to the functions of each logic element forming part of each of the two logic circuits to be processed in the equivalence verification, and also refers to the connection between the logic elements.

To verify the equivalence of the logic circuits, the logic circuit verifying system first appropriately retrieves, one by one, an internal signal line assumed to be equivalent from each logic circuit, and then determines whether or not the logic circuits are equivalent.

The signal line selecting unit selects a signal line which is located closer to the input terminal than the two internal signal lines retrieved one by one for comparison from the two logic circuits, and affects the two internal signal lines. Then, the signal line selecting unit adds the selected signal line to the first set of signal lines. Since these signal lines at the input terminal are very important in determining the equivalence of two internal signal lines, the first set of signal lines, including those signal lines, is generated and stored in the circuit information storage unit.

The logical function generating unit generates a logical function of each of the two internal signal lines using the circuit information and the first set of signal lines. At this time, the signal line contained in the first set of signal lines is used as a pseudo-input of a logical function.

The determining unit determines whether or not the two signal lines are equivalent from the forms of the two generated logical functions. If the forms of these logical functions are similar to each other, it is determined that the two internal signal lines to be determined are equivalent to each other. According to the determination result, the determining unit checks whether or not the two logic circuits are functionally equivalent.

Since the first set of signal lines contains at least one common signal line affecting the two internal signal lines to be processed, the two logical functions are represented using the common signal line. Therefore, if the internal signal lines are equivalent, there is a great possibility that the two corresponding logical functions are equivalent in form. As a result, the information about equivalent internal signal lines can be efficiently obtained, thereby gradually limiting the circuit to be verified.

For example, if pairs of equivalent internal signal lines are sequentially determined in order from the pair closest to the external input of the two logic circuits, then the circuits to be verified are limited between the internal signal lines and the external outputs. Finally, the pair of external outputs corresponding to the two logic circuits are compared, and the logical functions are similarly generated for equivalence verification. Thus, since the information about equivalent internal signal lines is correctly and efficiently obtained, the equivalence verification of a logic circuit can be performed at a high speed.

The signal line selecting unit can leave relatively independent signal lines that do not depend to a large extent on other signal lines in the obtained first set of signal lines. Removing signal lines dependent on other signal lines from the first set of signal lines enhances the possibility that the logical functions of equivalent internal signal lines match each other. Therefore, the equivalence of internal signal lines is determined at a higher speed.

BRIEF DESCRIPTION OF THE DRAWINGS

FIG. 2A shows the principle of the logic circuit verifying system according to the present invention;

FIG. 5 is a flowchart showing the signal line equivalence verifying process;

FIG. 6 is a flowchart showing the signal line set obtaining process;

FIG. 11 shows another example of obtaining a set of signa lines.

DESCRIPTION OF THE PREFERRED EMBODIMENTS

Figure 1A:
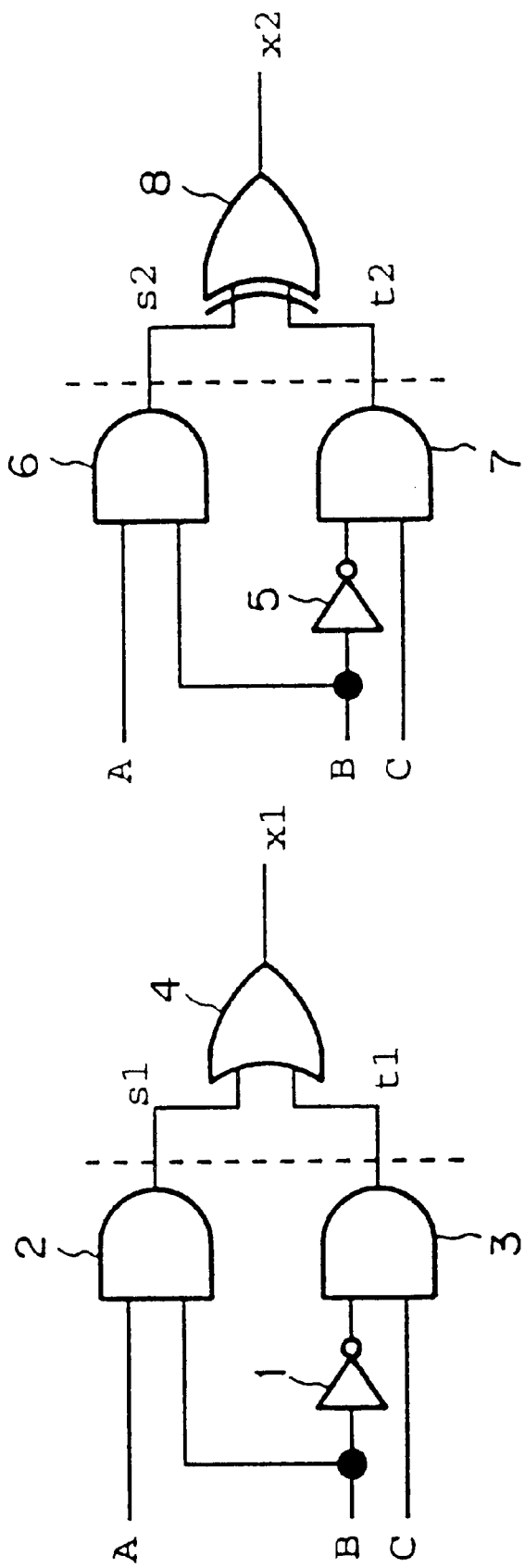
FIG. 1A shows an example of equivalent circuits different in structure.
Figure 1B:
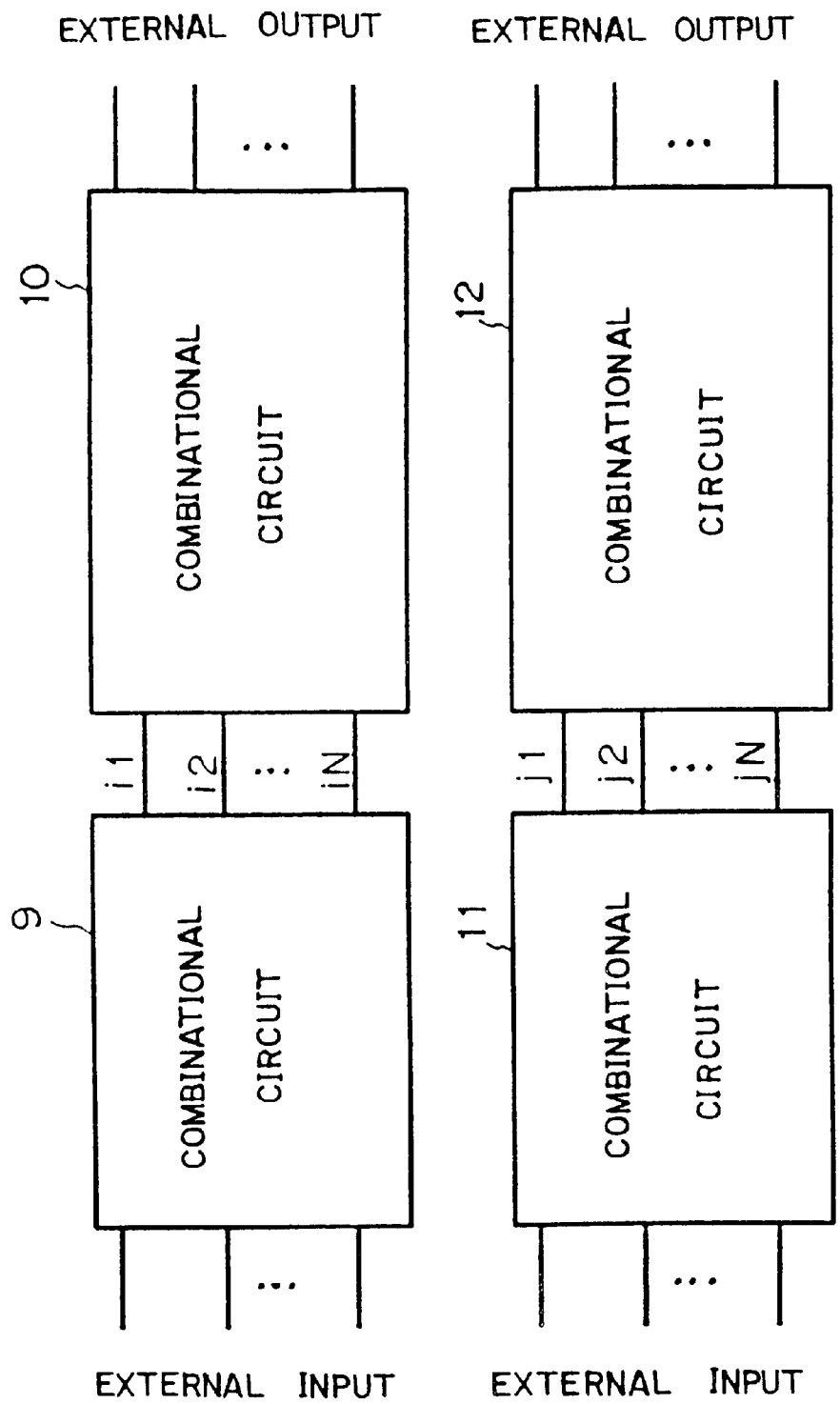
FIG. 1B shows an example of difficult circuits in verification.

The embodiments of the present invention are described below by referring to the attached drawings.

FIG. 2A shows the principle of the logic circuit verifying system according to the present invention. The logic circuit verifying system shown in FIG. 2A comprises a circuit information storage unit 21, a signal line selecting unit 22, a logical function generating unit 23, and a determining unit 24.

The circuit information storage unit 21 stores the circuit information relating to a plurality of logic elements forming the above described two logic circuits and the first set of signal lines for use in verification.

The signal line selecting unit 22 is located closer to the input terminal than the two signal lines retrieved one by one for comparison from the above described two logic circuits. Signal line selecting unit 22 selects signal lines affecting the two signal lines, and adds them to the first set of signal lines.

The logical function generating unit 23 generates a logical function of each of the two signal lines using the circuit information and the first set of signal lines.

The determining unit 24 determines whether or not the two signal lines are equivalent to each other from the form of the generated two logical functions.

The circuit information storage unit 21 stores, as circuit information, the functions of each logic element forming part of each of the two logic circuits to be verified and the connection between the elements. The logic circuit verifying system retrieves one by one the internal signal lines estimated to be equivalent to each other from each of the logic circuits, and then determines whether or not they are actually equivalent to each other.

The signal line selecting unit 22 selects a signal line, at an input terminal, that affects the retrieved two internal signal lines, generates the first set of signal lines including the selected signal, and stores it in the circuit information storage unit 21. The logical function generating unit 23 generates a logical function of each of the two internal signal lines to be compared, using the signal lines contained in the first set of signal lines as pseudo-inputs. The determining unit 24 determines that the two internal signal lines to be determined are equivalent if the forms of the generated logical functions are similar to each other.

Since the first set of signal lines contains at least one common signal line affecting the two internal signal lines to be determined, the two logical functions are represented by the common signal lines. Therefore, if the internal signal lines are equivalent to each other, there is a great possibility that the forms of the corresponding two logical functions are equivalent to each other. As a result, the information about equivalent internal signal lines between the two logic circuits can be efficiently obtained. The circuit to be verified can be limited according to a pair of the obtained equivalent signal lines.

If, for example, pairs of equivalent internal signal lines are sequentially determined from the line closest to the external input of the two logic circuits, then the circuit to be verified is limited to the portion from the position of the internal signal line to the external output. Finally, a pair of the external outputs corresponding to the two logic circuits are compared. The logic functions are likewise generated for use in the equivalence verification, and the verification result is output. Thus, equivalent internal signal line information is correctly and efficiently obtained, and the equivalence of logic circuits is verified at a high speed.

The logical function generating unit 23 generates a logical function indicating the difference between the logical functions of the two internal signal lines. In this case, the determining unit 24 determines that two internal signal lines are equivalent if the logical function indicating the difference constantly indicates 0. Such a logical function indicating the difference can be generated by, for example, obtaining an exclusive OR of two internal signal lines.

The signal line selecting unit 22 leaves only a signal line independent of other signal lines in the obtained first set of signal lines. The logical function generating unit 23 generates the logical functions of two internal signal lines to be determined using these independent signal lines as pseudo-inputs.

For example, assume that a signal line represented by the logical function of another signal line is contained in the first set of signal lines. Since the generated logical function of the internal signal line to be determined contains such a signal line, the dependency on other signal lines may not be explicitly represented. Therefore, even if the two internal signal lines are equivalent, the forms of the logical functions may not match accordingly.

If the logical functions of the two internal signal lines are generated using only independent signal lines, then the dependency on the signal lines is clarified, and there is a greater possibility that the logical functions of two equivalent internal signal lines match each other. Therefore, the equivalence of the internal signal lines can be efficiently determined, thereby speeding up the equivalence verification of the logical circuits.

Figure 2B:
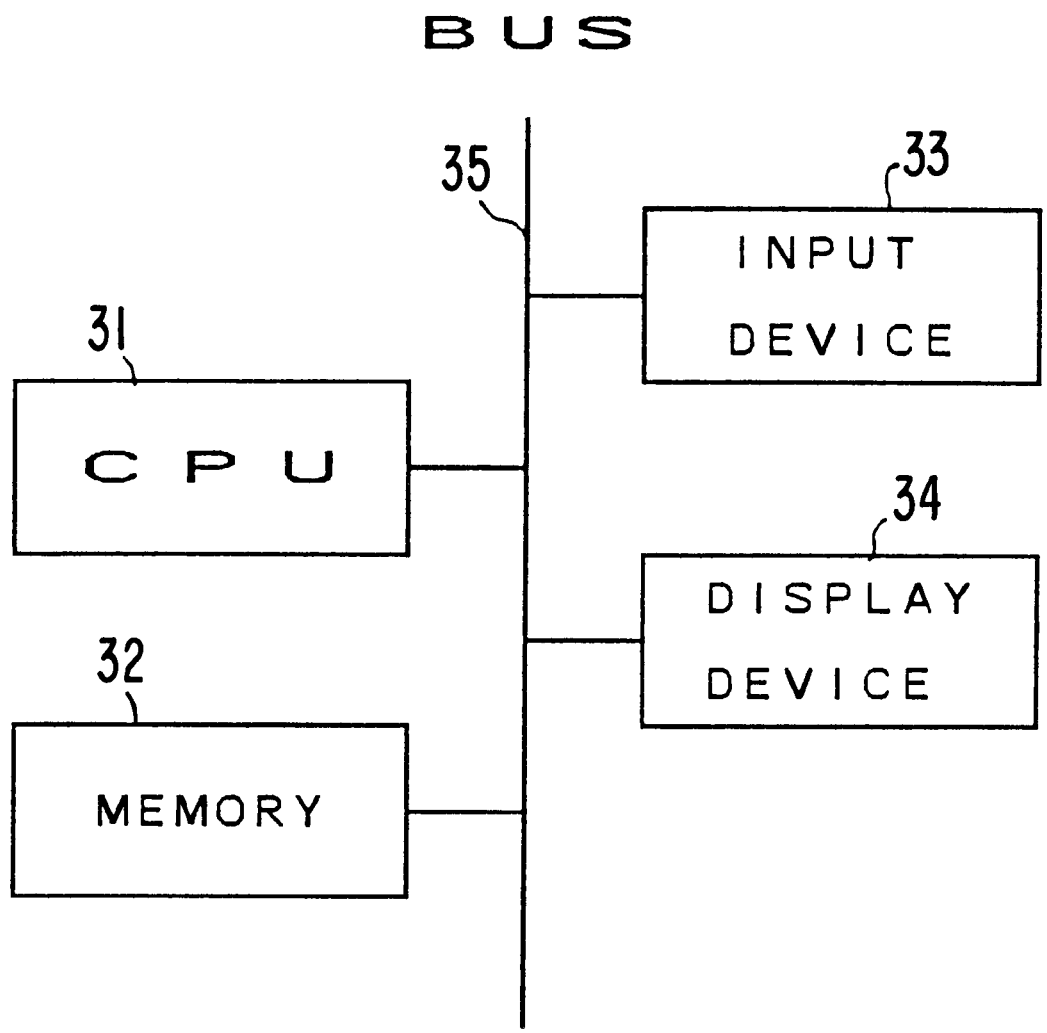
FIG. 2B shows the configuration of the computer system used in an embodiment of the present invention.

For example, the circuit information storage unit 21 shown in FIG. 2A corresponds to a memory 32 shown in FIG. 2B. The signal line selecting unit 22, the logical function generating unit 23, and the determining unit 24 correspond to a central processing unit (CPU) 31 and the memory 32.

FIG. 2B shows the configuration of the logic circuit verifying system according to the present embodiment. The logic circuit verifying system shown in FIG. 2B can be realized by an information processing apparatus comprising the CPU 31, memory 32, an input device 33, a display device 34, and a bus 35 for connecting them. The input device 33 can be, for example, a key board, a pointing device, etc., for use by an operator in specifying a logic circuit to be verified. The display device 34 can be, for example, a display device for displaying a logic circuit, verification result, etc. The memory 32 stores the data of a logic circuit and the program of an equivalence verifying process. The CPU 31 displays the specified logic circuit on the screen of the display device 34 and performs an equivalence verifying process using the memory 32.

Figure 3:
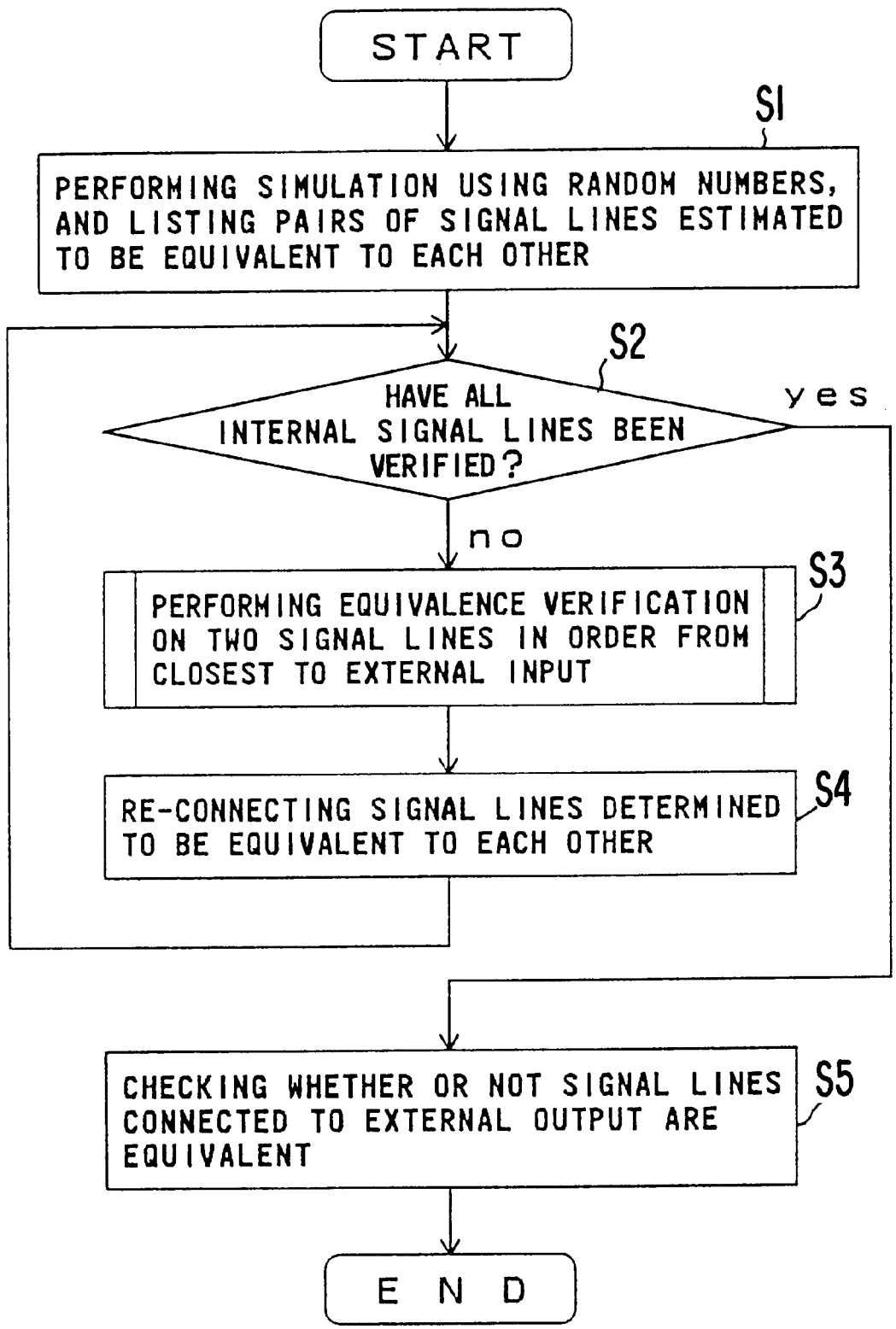
FIG. 3 is a flowchart showing the circuit equivalence verifying process.

FIG. 3 is a flowchart showing the process of verifying the equivalence of logic circuits. When the process starts as shown in FIG. 3, the CPU 31 first applies an input pattern generated by random numbers to an external input of two specified circuits, and performs a logical simulation. In the logical simulation, the value of each of the internal signal lines of two circuits is checked for each input pattern, and a set of internal signal lines assumed to be equivalent to each other are listed (step S1). At this time, a set of the internal signal lines indicating the same value for all applied input patterns is added to a candidate list for a set of equivalent signal lines. Since the simulation cannot be performed individually for all input patterns, the list contains a set of signal lines incidentally indicating the same value for input patterns. Such a set of signal lines should be deleted in the later process. The number of input patterns is determined to, for example, be a constant value after all values of the signal lines to be simulated have stopped changing.

Next, sets of internal signal lines assumed to be equivalent to each pair are retrieved from the candidate list in order, starting from the set closest to the external input. The equivalence verification is performed on the signal lines. First, it is determined whether or not all internal signal lines have been verified for equivalence (step S2). If any set of unprocessed internal signal lines remains, the equivalence verification is performed on the two signal lines closest to the external input (step S3). If a set of the internal signal lines is determined to be equivalent to each pair, then one of the equivalent internal signal lines is left as a representative and the other is re-connected to the representative signal line. Then, the signal lines are added to the list of the equivalent signal line sets (step S4). The equivalence verifying process on an internal signal line is described later in detail.

Figures 4A, 4B:
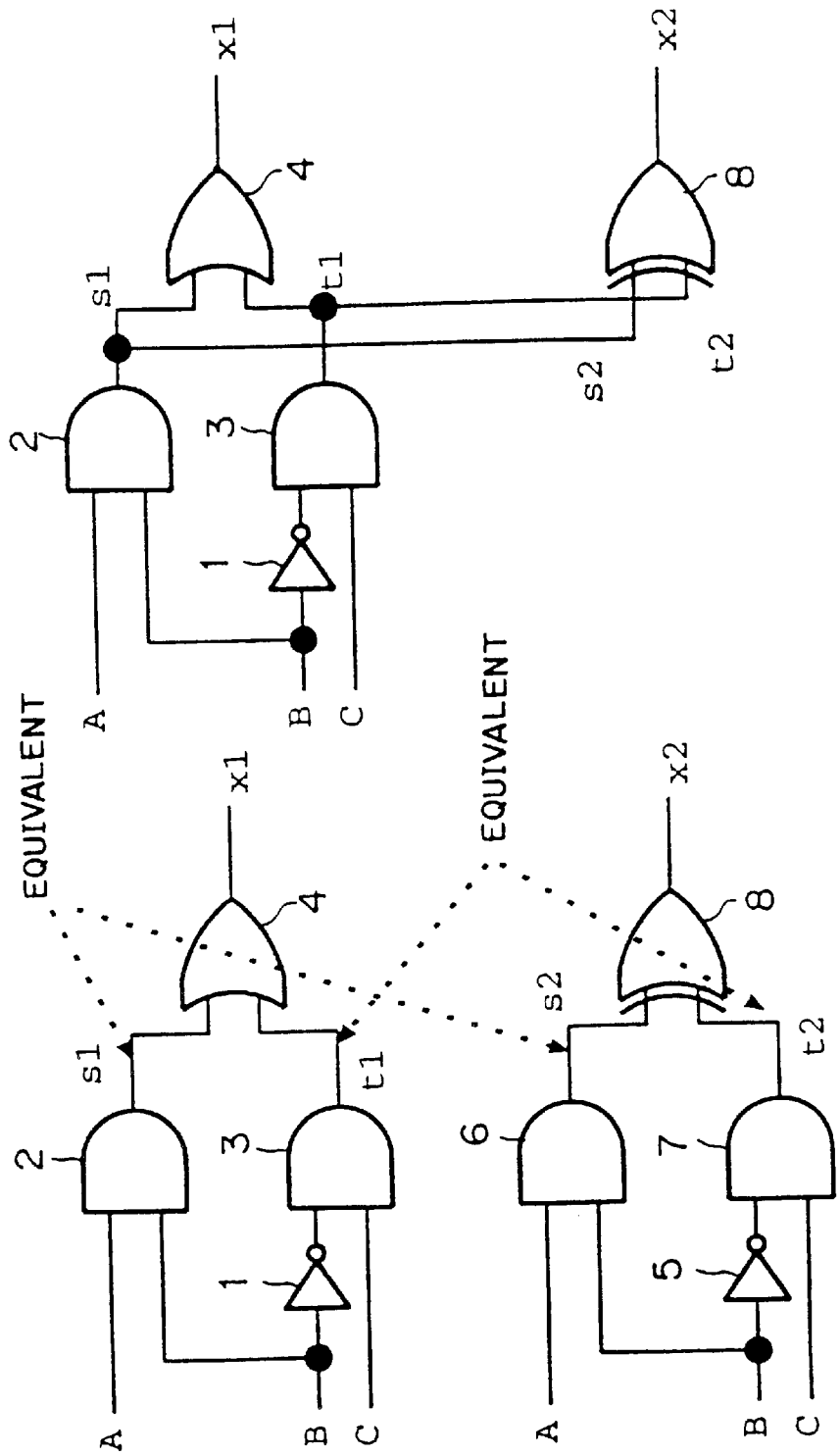
FIG. 4A shows the circuit before the equivalence signal line is reconnected.
FIG. 4B shows the circuit after the equivalence signal line has been reconnected.

FIGS. 4A and 4B show examples of re-connecting signal lines determined to be equivalent in the two circuits shown in FIG. 1A. In the circuit shown in FIG. 4A in which the circuit has not been reconnected, if it is determined that the internal signal lines s1 and s2 are equivalent to each other, and that the internal signal lines t1 and t2 are equivalent to each other, then s1 and t2 are left as representative signal lines as shown in FIG. 4B, and s2 and t2 are respectively re-connected to s1 and t1. As a result, an XOR gate 8 is separated from AND gates 6 and 7 and connected to AND gates 2 and 3 to generate a new 3-input-2-output logic circuit.

The above described processes are performed sequentially from the external input to the external output. If no unprocessed internal signal lines are detected in step S2, it is checked whether or not a corresponding set of external outputs is equivalent (step S5), and the process terminates. If the list of equivalent signal line sets contains all corresponding sets of external outputs, then the equivalence of the two circuits are verified. In this method, a set of equivalent internal signal lines is obtained sequentially from the external input. Therefore, if a set of equivalent signal lines has been obtained, the equivalence should be verified from their position to the external output. Thus, the circuit to be verified can be limited to a small portion.

FIG. 5 is a flowchart showing the equivalence verifying process performed on a signal line in step S3 shown in FIG. 3. When the process starts as shown in FIG. 5, the CPU 31 first generates the following logical function from a set of signal lines $X_0 = \{a, b\}$ to check whether or not the signal lines a and b to be compared are equivalent to each other (step S11).

$$R_0(X_0) = a \oplus b$$
$$= a \cdot \overline{b} + \overline{a} \cdot b$$

The $R_0$ ($X_0$) indicates an exclusive OR of a and b. If a and b are equivalent to each other, the $R_0$ ($X_0$) is constantly 0. On the other hand, if $R_0$ ($X_0$)=1, then a is not equivalent to b.

Then, to check whether or not $R_0$ ($X_0$) equals 1, a loop process is performed from step S12 to step S16 with i set to 0. In the loop process, a set of independent signal lines $X_{i+1} = \{s^{i+1}_1, s^{i+1}_2, \ldots\}$, which is positioned closer to the input terminal than the $X_i$ and affects the largest possible number of signal lines contained in the $X_i$, is obtained based on the set of two or more signal lines $X_i = \{s^i_1, S^i_2, \ldots\}$ (step S12). The method of obtaining such $X_{i+1}$ is described later.

Next, the logical function $R_i$ ($X_i$) of a given $X_i$ is represented as the logical function $R_{i+1}$ ($X_{i+1}$) of a signal line contained in the $X_{i+1}$ (step S13). At this time, logical functions $F^i_1$ ($X_{i+1}$), $F^i_2$ ($X_{i+1}$), ... are computed using each of the elements $s^i_1, s^i_2, \ldots$ of $X_i$ as a pseudo-output signal and $X_{i+1}$ as a set of pseudo-input signals. Thus, $R_{i+1}$ ($X_{i+1}$) is computed by the following equation using $F^i_j$ ($X_{i+1}$) and $R_i$ ($X_i$).

$$R_{i+1} = \exists s^i_1, s^i_2, \ldots R_i(X_i) \cdot \{s^i_1 = F^i_1(X_{i+1})\} \cdot \{S^i_2 = F^i_2(X_{i+1})\} \ldots \quad (1)$$

where $s^i_{j=F^i_j}$ ($X_{i+1}$) indicates the following logical function.

$$s^i_j \quad F^i_j(X_{i+1}) + \overline{s^i_j \cdot F^i_j(X_{i+1})}$$

In equation (1), $R_{i+1}$ ($X_{i+1}$) indicates a combination of values assignable to the pseudo-input $X_{i+1} = \{s^{i+1}_1, s^{i+1}_2, \ldots\}$ when $R_i$ ($X_i$)=1. Therefore, if $R_{i+1}$ ($X_{i+1}$)=0 as a result of equation (1), no combination of $X_{i+1}$ exists to output $R_i$ ($X_i$)=1. Since the loop process starts with i=0, the original value $R_0$ ($X_0$)=0 is effective if $R_{i+1}$ ($X_{i+1}$)=0 for a given i, thereby verifying that the elements a and b of $X_0$ are equivalent to each other.

Then, it is checked whether or not $R_{i+1}$ ($X_{i+1}$) equals 0 (step S14). If $R_{i+1}$ ($X_{i+1}$)=0, then the process terminates with the verification successfully performed. If $R_{i+1}$ ($X_{i+1}$)≠0, then it is checked whether or not $X_i$ corresponds to an external input (step S16) with i set to i+1 (step S15). If $X_i$ is not an external input, the processes in and after step S12 are repeatedly performed. If the $X_i$ finally has become an external input in step S16 after repeating the loop process, then $R_0$ ($X_0$) may be equal to 1 when an appropriate external input is selected. Therefore, a is not equivalent to b in $X_0$, and the process unsuccessfully terminates.

According to the signal line equivalence verifying process shown in FIG. 5, it is completely verified that two signal lines are equivalent to each other. Therefore, a correct verification can be constantly performed on a pair of internal signal lines assumed to be equivalent to each other as listed in step S1.

In the conventional methods suggested by Reddy, Jain, etc., the equivalence of internal signal lines is evaluated by an incomplete verifying method referred to as a recursive learning method or a functional learning method. Therefore, some actually equivalent internal signal lines may not be verified. As a result, little information about internal signal lines is provided for use in verifying the equivalence of external outputs, thereby taking a long time on verification or causing a problem that the verification cannot be performed within an actual time.

However, according to the method of the present invention, all equivalent signal lines can be correctly verified, and more information about equivalent internal signal lines can be obtained. Thus, a verification can be efficiently performed.

The process of obtaining a set of next signal lines $X_{i+1}$ in step S12 shown in FIG. 5 and the process of verifying the equivalence of signal lines using the obtained $X_{i+1}$ are described by referring to FIGS. 6 through 11.

FIG. 6 is a flowchart showing the process of obtaining a set of next signal lines $X_{i+1}$ from a set of signal lines $X_i$. When the process starts as shown in FIG. 6, the CPU 31 labels a signal line in the fan-in direction from each of the elements $s^i_1, s^i_2, \ldots$ (step S21). In the labelling process, the label of a signal line s closer to the input terminal than the $s^i_1, s^i_2, \ldots$ is represented by L(s), and the initial label values of the signal lines are set to 0. Then, signal lines which can be traced from a signal line contained in the $X_i$ in the input direction are labelled, and the labels are incremented by one. If such an adding process is performed on all elements in the $X_i$, then the time of labelling operations is recorded as L (s) on the signal line s at the input terminal of the $X_i$. The label value L (s) indicates the number of signal lines, in the signal lines contained in the $X_i$, that may be affected by the signal line s.

Then, the labelled signal lines are sequentially checked from the input terminal, and the largest value is obtained from among the label value of the signal line s and the label values of all signal lines on its fan-in side. The obtained largest value is represented as the largest label value M (s) (step S22). Assuming that the direct fan-in of the signal line s is $t_1, t_2, \ldots$, the M (s) is computed by the following equation (2)

$$M(s)=\max(L(s), \max_k M(t_k)) \qquad (2)$$

where $\max_k M(t_k)$ indicates the largest value of each of the largest values of the signal lines $t1, , t_2, \ldots$ while max ($\alpha$, $\beta$) indicates the maximum values of $\alpha$ and $\beta$. The largest label value M (s) indicates the largest number of elements in the $X_i$ that may be affected by the signal lines closer to the input terminal than the signal line s. The label value L (s) and the largest label value M (s) are stored in the memory 32 with the identifier of the signal line s.

Then, a search is made again from each of the signal lines $s^i_1, s^i_2, \ldots$ in the fan-in direction to select a signal line having L (s) and M (s) equal to each other and the closest to $s^i_1, s^i_2, \ldots$ as a candidate for an element of $X_{i+1}$. The selected signal line is marked in the memory 32 (step S23). Thus, a signal line having L (s) smaller than M (s) is excluded from the elements of the $X_{i+1}$, and the signal line labelled by the largest number of elements of the $X_i$ is selected as a pseudo-input of the logical function $R_{i+1}(X_{i+1})$.

Thus, the relationship between the original signal lines can be represented by selecting a signal line labelled by a number of elements of the $X_{i+1}$ as a candidate for the next signal line. The relationship between the original signal lines refers to, for example, the dependency indicating that $s^i_3$ always equals 1 when both $s^i_1$ and $s^i_2$ are 0. When the set $X_{i+1}$ of the next signal lines representing the relationship between the original signal lines is obtained, $R_{i+1}(X_{i+1})$ can be 0 even if $R_i(X_i)$ is not 0.

Figure 7:
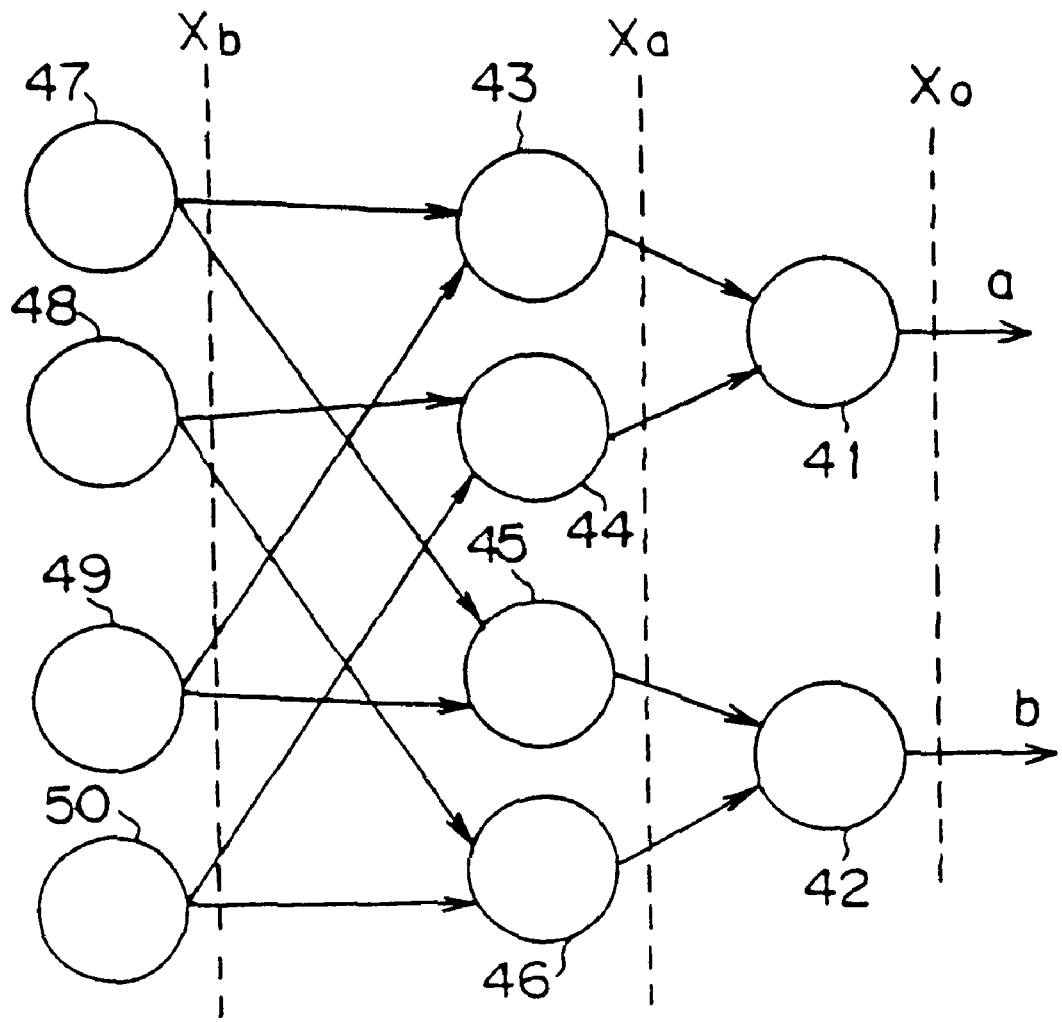
FIG. 7 shows an example of a set of signal lines.

FIG. 7 shows an example of the set $X_1$ of the next signal lines to the set $X_0$ of signal lines. In FIG. 7, the signal lines a and b to be verified for equivalence are output signals of the partial circuit comprising logic elements 41, 42, 43, 44, 45, 46, 47, 48, 49, and 50. Each of the logic elements is a 1-output gate element, and the arrows from the same logic element refer to equal outputs.

For example, even if a logic function is generated for a pseudo-output $X_0=\{a, b\}$ using the set $X_a$ of the output signal lines of the logic elements 43, 44, 45, and 46 as a new pseudo-input, each signal line of $X_a$ does not affect the logic element 41 or 42. Therefore, the relationship between the elements a and b of the $X_0$ cannot be represented. On the other hand, if a logical function is generated using the set $X_b$ of the output signal lines of the logic elements 47, 48, 49, and 50 as a pseudo-input, then each signal line of the $X_b$ affects both logic elements 41 and 42, the relationship between a and b may be represented. In this case, $X_b$, not $X_a$, should be preferably selected as the set $X_1$ of the next signal lines.

Figure 8:
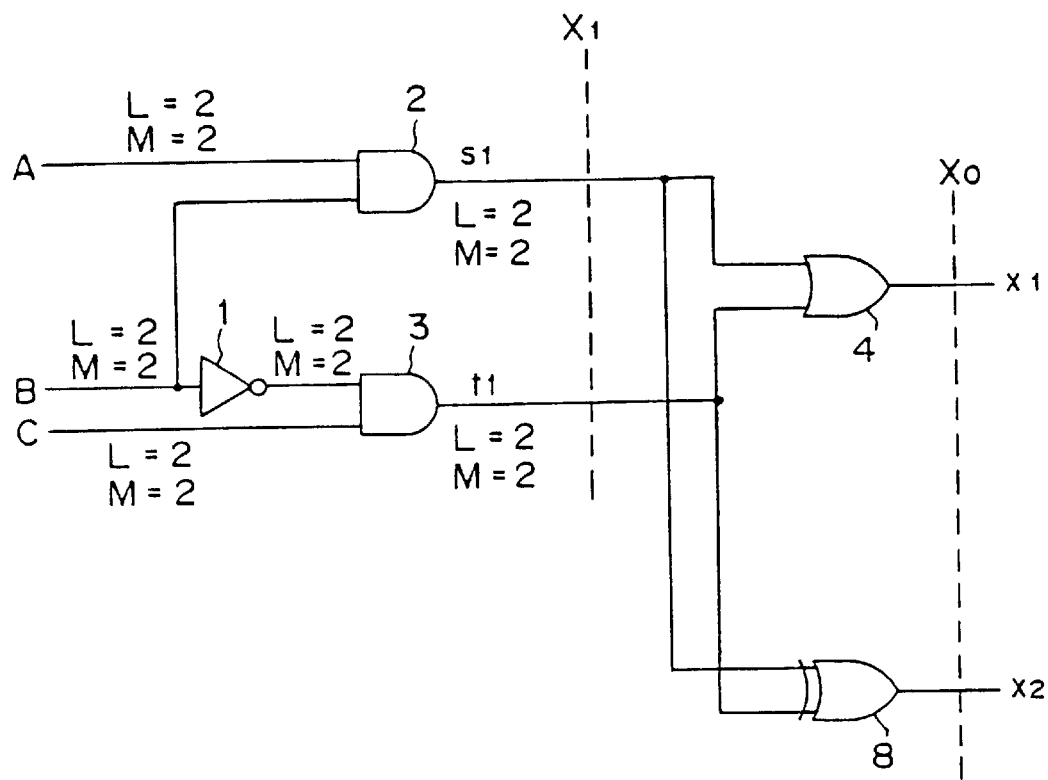
FIG. 8 shows an example of a label value for obtaining $X_1$.

The labelling process is described below by referring to an example of the circuit shown in FIG. 4B. FIG. 8 shows the label value obtained when $X_1$ is computed from $X_0=\{x1, x2\}$ in verifying the equivalence of two outputs x1 and x2 of the circuit shown in FIG. 4B. In FIG. 8, the inputs of an OR gate 4 and the XOR gate 8 are connected to the signal lines s1 and t1. Therefore, the signal lines are labelled by both signal lines x1 and x2. Thus, L (s1) and L (t1) are equal to 2. Since all signal lines closer to the input terminal than s1 and t1 can be traced from x1 and x2, their label values L equal 2 (step S21). If the signal lines A, B, and C are external inputs, then L (A)=L (B)=L (C)=2. Accordingly, the maximum label values corresponding to these signal lines match these label values as M(A)=M(B)=M(C)=2. Therefore, according to equation (2), the maximum label value M of all labelled signal lines is 2 (step S22).

If the label values and the largest label value are checked in the fan-in direction from the signal lines x1 and x2, then L (s1)=M (s1)=2, and L (t1)=M (t1)=2. Then, the signal lines s1 and t1 are marked as a candidate for the set $X_1$ of the next signal lines (step S23).

Next, the fan-in of a signal line marked in step S23 is checked to delete the mark of a signal line when the number of the unmarked fan-in is smaller than a predetermined number, and its label value L is set to 0 (step S24). Then, it is determined whether or not there is a signal line whose mark has been deleted (step S25). If yes, the processes in and after step S23 are repeated and the next set of signal lines is modified. The label value L of a signal line is set to 0 once its mark has been deleted, and is different from the largest label value M. As a result, it is not marked again.

If a signal line has an unmarked fan-in whose number is smaller than a predetermined value, then it refers to a signal line having a high ratio of marked fan-in. Such a value of a signal line greatly depends on the value of another marked signal line. Accordingly, removing the mark of the signal line leaves as candidates for the next signal lines only signal lines completely or relatively independent of other signal lines. Then, in step S23, the unmarked fan-in of the mark-removed signal lines are traced to obtain a new signal line where L=M. At this time, it takes a long time to perform the process if there are a great number of unmarked fan-in. Therefore, it is desired that the number of unmarked fan-in is limited to one or less in step S24.

Otherwise, the upper limit of the number of marked signal lines can be defined in step S23, and the mark on the signal line can then be removed within the range of the upper limit in step S24. That is, the mark of a signal line is removed if it is estimated that the number of candidates for the next signal line is equal to or smaller than the upper limit of the signal as a result of the remarking after removing the initial marks even if the signal line has a lot of unmarked fan-in. This operation reduces the number of the elements of the next set $X_{i+1}$ of the signal lines to a value equal to or smaller than the upper limit.

These processes are repeated until the candidate for the next signal line is fixed. If mark-removed signal lines are not detected in step S25, then the finally marked signal lines are defined as elements of the $X_{i+1}$ (step S26), and the process terminates.

For example, marks are removed from a signal line in which the number of unmarked fan-in is equal to or smaller than 1 in FIG. 8. At this time, there are two fan-in for the AND gate 2 having a marked signal line s1 as an output. Since the two fan-in are unmarked, they do not satisfy the condition of removing marks (step S24). Likewise, the signal line t1 does not satisfy the condition, and therefore, the marks of these two signal lines are not removed, thereby leaving s1 and t1 as elements of the $X_1$ (step S26).

Next, in step S13 shown in FIG. 5, $R_1$ ($X_1$) is computed from the obtained $X_1$. Since $X_0=\{x1, x2\}$, the following equation is set.

$$R_0(X_0) = x1 \oplus x2$$

If x1 and x2 are represented as the functions of $X_1=\{s1, t1\}$, they are set as follows.

$$x1 = s1 + t1$$

$$x2 = s1 \oplus t1 = s1 \cdot \overline{t1} + \overline{s1} \cdot t1$$

Therefore, equation (3) is set as follows $$\begin{aligned} R_1(X_1) &= \exists x1, x2 R_0(X_0) \cdot [x1 \equiv s1 + t1] \cdot \\ & \quad [x2 \equiv s1 \cdot \overline{t1} + \overline{s1} \cdot t1] \\ &= \exists x1, x2(x1 \oplus x2) \cdot [x1 \equiv s1 + t1] \cdot \\ & \quad [x2 \equiv s1 \cdot \overline{t1} + \overline{s1} \cdot t1] \end{aligned} \quad (3)$$

When the right part of equation (3) is computed, the result is output as a rewriting using s1 and t1 substituted for x1 and x2 of $R_0$ ($X_0$).

$$\begin{aligned} R_1(X_1) &= (s1 + t1) \oplus (s1 \cdot \overline{t1} + \overline{s1} \cdot t1) \\ &= s1 \cdot t1 \end{aligned} \quad (4)$$

Since the logical function in the right part of equation (4) is not 0, the next set $X_2$ of signal lines is obtained from the $X_1$ (step S12). Then, the processes in steps S21 and S22 are performed.

Figure 9:
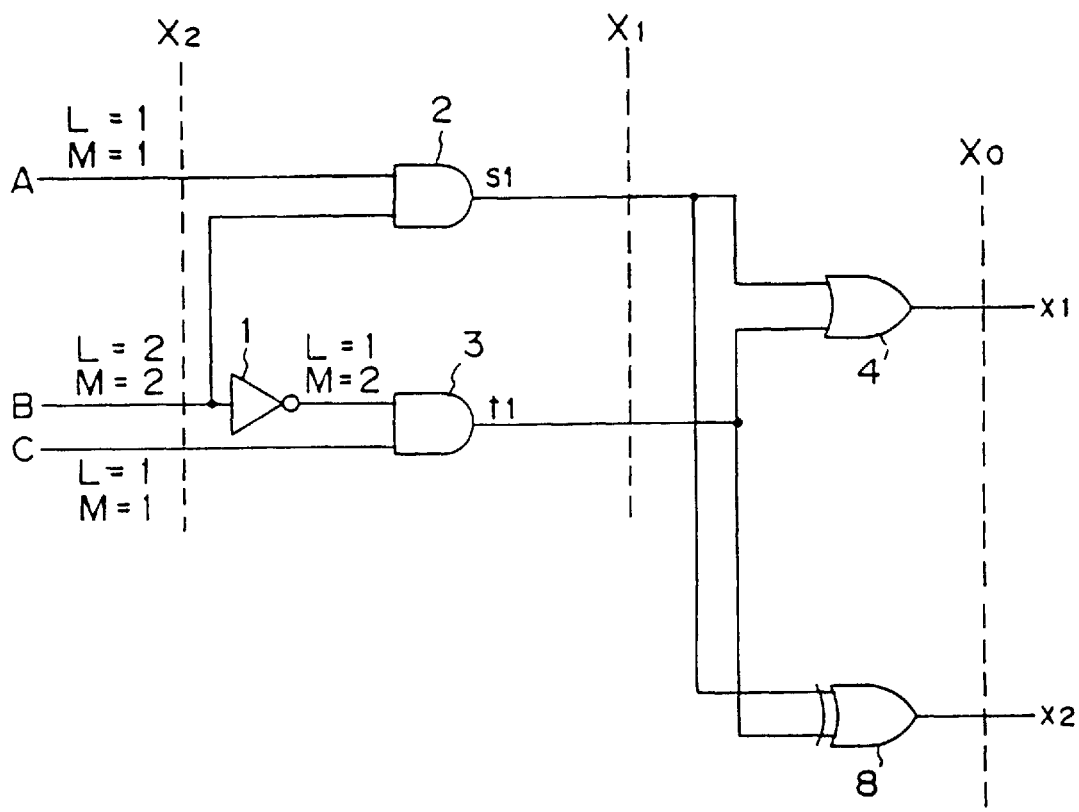
FIG. 9 shows an example of a label value for obtaining $X_2$.

FIG. 9 shows the label value when $X_2$ is obtained from $X_1=\{s1, t1\}$ shown in FIG. 8. Since the signal line A shown in FIG. 9 is labelled only from the signal line s1, L(A) and M(A) equal 1. Since the signal line B is labelled from s1 and t1, L(B) and M(B) equal 2. Since the output signal of a NAND gate 1 and signal line C are labelled from t1, the label value L is 1. At this time, the label value of the input signal line of the NAND gate 1 is 2. Therefore, the largest label value M of the output signal line is 2 and is different from the label value L. On the other hand, the largest label value M (C) of the signal line C is 1, and is equal to L (C).

When the label value and the largest label value are checked in the fan-in direction from the signal lines s1 and t1, L (A)=M (A)=1, an L (B)=M (B)=2, and L (C)=M (C)=1. These signal lines A, B, and C are marked so as to process them as a candidate for the next set $X_2$ of signal lines (step S23). In this example, the output signal line of the NAND gate 1 affecting only t1 is skipped, and the signal line B affecting both s1 and t1 is selected as a candidate for an element of the $X_2$. The signal lines A, B, and C contained in the $X_2$ are external inputs, and therefore have no fan-in. Therefore, no marks are removed in step S24, and the set of these signal lines is defined as $X_2$ (step S26).

Next, in step S13 shown in FIG. 5, the $R_2$ ($X_2$) is computed from the obtained $X_2$. First, s1 and t1 are represented as the functions of $X_2=\{A, B, C\}$ as follows.

$$s1 \equiv A \cdot B$$

$$t1 \equiv \overline{B} \cdot C$$

Therefore, the following equation is set according to equations (1) and (4).

$$\begin{aligned} R_2(X_2) &= \exists s1, t1 R_1(X_1) \cdot [s1 \equiv A \cdot B] \cdot [t1 \equiv \overline{B} \cdot C] \\ &= \exists s1, t1(s1 \cdot t1) \cdot [s1 \equiv A \cdot B] \cdot [t1 \equiv \overline{B} \cdot C] \\ &= A \cdot B \cdot \overline{B} \cdot C \\ &= 0 \end{aligned}$$

where $R_2$ ($X_2$)=0 and it is verified that the original output signal lines x1 and x2 are equivalent to each other.

If x1 and x2 are external output, the determination result in step S2 shown in FIG. 3 is "yes", that is, it is determined that the two circuits shown in FIG. 4A are equivalent to each other (step S5), thereby terminating the process.

Figure 10:
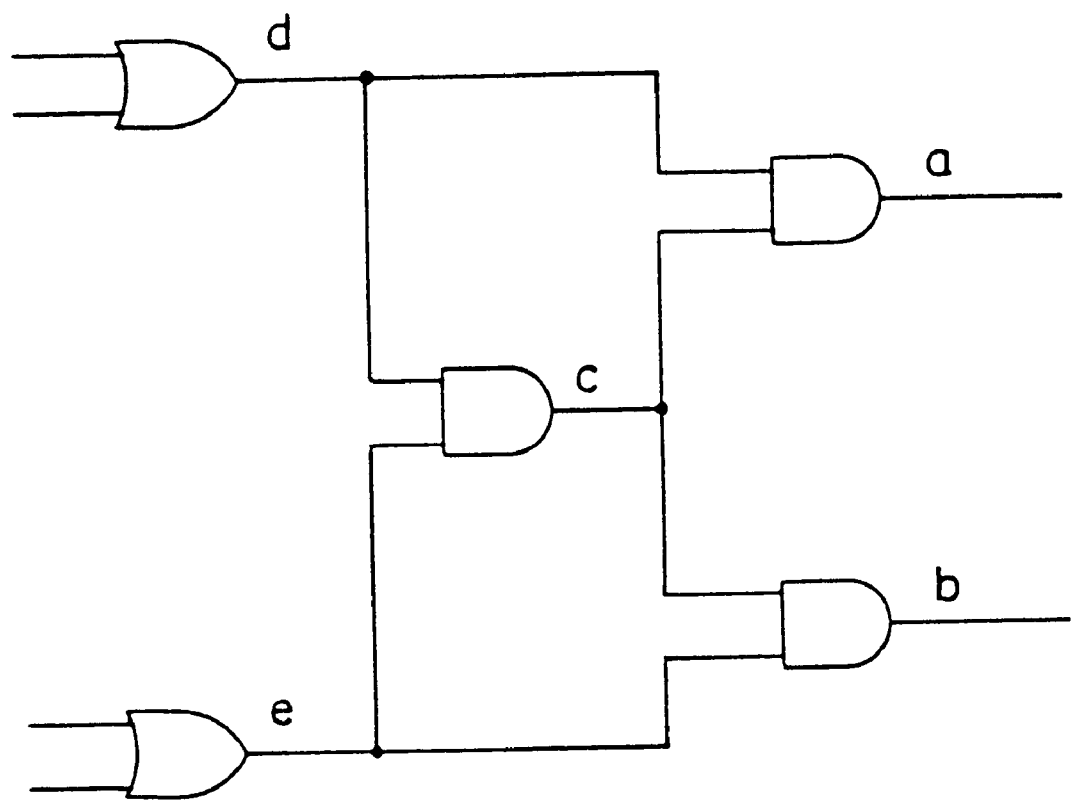
FIG. 10 shows an example of a set of independent signal lines.

Only independent signal lines are left as candidates by removing the marks of specific signal lines in step S24 shown in FIG. 6 so that, for example, the case shown in FIG. 10 can be appropriately processed. In the logic circuit shown in FIG. 10, the relationship between the signal lines a and b is represented as follows using a set of signal lines $\{c, d, e\}$.

$$a = c \cdot d$$

$$b = c \cdot e$$

where it is not certain whether or not a and b are equivalent to each other. However, if the signal line c dependent on d and e is excluded from $\{c, d, e\}$, the relationship is represented as follows using a set of signal lines $\{d, e\}$.

$$a = d \cdot e \cdot d = d \cdot e$$

$$b = d \cdot e \cdot e = d \cdot e$$

The equations apparently indicate that a and b are equivalent to each other. Thus, the equivalence verification can be efficiently performed by excluding a signal independent of other signal lines from the pseudo-input of a logical function.

In the logic circuit shown in FIGS. 8 and 9, there are no signal lines whose mark is removed in step S24. Next, the process in FIG. 6 is described by referring to the example of the logic circuit shown in FIG. 11. In the circuit shown in FIG. 11, a set of the output signal line y1 of an AND gate 51 and an output signal line y2 of an AND gate 52 is defined as $X_0$, and the next set $X_1$ of signal lines is obtained from $X_0$.

Assume that a label is assigned to each of the output signal lines y3, y4, y5, y6, y7, and y8 of an OR gate 53, AND gates 54 and 55, and OR gates 56, 57, and 58. If the labelling process starts with y1 and y2, the label values are L (y3)=L (y5)=1, and L (y4)=L (y6)=L (y7)=L (y8)=2 (step S21). If M (y5)=1 and M (y6)=M (y7)=M (y8)=2, then M (y3)=M (y4)=2 according to step S22).

When label values and the largest label value are checked in the fan-in direction starting with y1 and y2, the first equivalent signal lines are y5, y6, y4, and y8. These signal lines are marked as a candidate for the next set $X_1$' (step S23). Checking the fan-in of y4, y5, y6, and y8 indicates that each of y5, y6, and y8 has two unmarked fan-in, and y4 has marked fan-in y6 and y8 and an unmarked fan-in y7. Considering that the number of unmarked fan-in removes the marks of signal lines, the mark of y4 is removed, and L (y4) equals 0 (step S24).

Since some signal lines have their marks removed, a re-marking process is performed in step S23. In this process, the label values, etc. are checked in the fan-in direction from the mark-removed signal line y4, and the signal line 7 is newly marked. Thus, in step S24, y4 is removed from the candidate for the next signal line because it depends on other signal lined y6 and y8. In the consequent process in step S23, the independent signal line y7 is added to a candidate for the next set of signal lines. Since y7 has two unmarked fan-in, the marks are not removed (step S24), and the set of signal lines y5, y6, y7, and y8 is defined as $X_1$ (step S26).

As described above, a set of input signals that affect the largest possible number of output signals and are independent of each other is required in step S23 shown in FIG. 5. Therefore, the equivalence verification of an internal signal line can be correctly performed at a high speed. As a result, the circuit to be verified can be gradually reduced according to the information about the internal signal lines determined to be equivalent to each other, thereby effectuating the equivalence verification of the entire circuit.

According to the present invention, the equivalence of internal signal lines can be completely checked in verifying the equivalence of two combinational logic circuit. Based on the result, the equivalence of logic circuits can be efficiently performed, thereby considerably reducing the time required for verification.

What is claimed is:

1. A logic circuit verifying system for use in an information processing system for verifying equivalence of two logic circuits and outputting a verification result, comprising:

circuit information storage means for storing circuit information about a plurality of logic elements forming the two logic circuits and a first set of signal lines used to verify the equivalence;

signal line selecting means for selecting and adding to the first set of signal lines, an internal signal line, positioned closer to an input terminal than two signal lines extracted for comparison respectively from the two logic circuits, and that affects both of the two signal lines;

logical function generating means for generating respective logical functions of the two signal lines according to the circuit information and the first set of signal lines; and determining means for determining whether the two signal lines are equivalent from the generated logical functions, and verifying the functional equivalence of the two logic circuits based on a determination result, wherein said logical function generating means computes the two respective logical functions using the first set of signal lines as a pseudo-input and the two signal lines as a pseudo-output, said determining means determines that the two signal lines are equivalent when the two logical functions are equivalent, and checks whether the first set of signal lines can be replaced by a set of input values so that output values of the two signal lines are different when the two logical functions are not equivalent, when the two logical functions are not equivalent, said signal line selecting means generates a second set of signal lines, including a signal line which is closer to the input terminal side than the first set of signal lines and affects two or more signal lines in the first set of signal lines, said logical function generating means generates a logical function of the first set of signal lines, using the second set of signal lines as a pseudo-input and the first set of signal lines as a pseudo-output, and said determining means checks, using the logical function of the first set of signal lines and the two logical functions, whether output values of the two signal lines can be different from each other.

2. The logic circuit verifying system according to claim 1, wherein said signal line selecting means removes a signal line highly dependent on other signal lines in the first set of signal lines, and leaves approximately independent signal lines to the first set of signal lines.

3. The logic circuit verifying system according to claim 1, wherein said signal line selecting means traces signal lines toward a fan-in side from the two signal lines, labels a signal line on a traces and adds a signal line labelled from both of the two signal lines to the first set of signal lines.

4. The logic circuit verifying system according to claim 1, wherein said signal line selecting means checks a direct fan-in of each signal line contained in the first set of signal lines, and removes from the first set of signal lines a signal line whose direct fan-in is contained in the first set of signal lines.

5. The logic circuit verifying system according to claim 1, wherein said signal line selecting means checks a direct fan-in of each signal line contained in the first set of signal lines, and removes from the first set of signal lines a signal line whose number of direct fan-in not contained in the first set of signal lines is smaller than a predetermined value.

6. The logic circuit verifying system according to claim 1, wherein said logical function generating means extracts a pair of signal lines sequentially from an external input terminal side of the two logic circuits, and generates a logical function of each of die pair of signal lines, and wherein said determining means rewrites the circuit information stored by said circuit information storage means according to information about the pair of signal lines determined to be equivalent.

7. The logic circuit verifying system according to claim 1, wherein said logical function generating means generates a logical function indicating a difference between the two signal lines from the two logical functions, and wherein said determining means determines, according to the logical function indicating the difference, whether the two signal lines are equivalent.

8. The logic circuit verifying system according to claim 1, wherein said signal line selecting means traces signal lines toward a fan-in side from the first set of signal lines, labels a signal line on a trace, and adds a signal line labelled from as many signal lines as possible that are contained in the first set of signal lines to the second set of signal lines.

9. The logic circuit verifying system according to claim 1, wherein said signal line selecting means removes a signal line highly dependent on other signal lines in the second set of signal lines, and leaves approximately independent signal lines in the second set of signal lines.

10. The logical circuit verifying system according to claim 1, wherein said signal line selecting means sequentially generates new sets of signal lines in an area from the second set of signal lines to an external input terminal of the two logic circuits, and said logical function generating means sequentially generates logical functions using a generated set of signal lines as a new pseudo-input and a set of signal lines preceding the generated set of signal lines as a pseudo-output, and wherein said determining means checks, using the generated logical functions, whether output values of the two signal lines are different from each other.

11. A logic circuit verifying system for use in an information processing system for verifying equivalence of two logic circuits and outputting a verification result, comprising;

circuit information storage means for storing circuit information about a plurality of logic elements forming the two logic circuits and a first set of signal lines used to verify the equivalence;

signal line selecting means for selecting, based on the number of fan-in, and adding to the first set of signal lines, an approximately independent internal signal line positioned closer to an input terminal than two signal lines extracted for comparison respectively from the two logic circuits;

logical function generating means for generating respective logical functions of the two signal lines according to the circuit information and the first set of signal lines; and determining means for determining whether the two signal lines are equivalent from the generated logical functions, and verifying the functional equivalence of the two logic circuits based on a determination result, wherein said logical function generating means computes the two respective logical functions using the first set of signal lines as a pseudo-input and the two signal lines as a pseudo-input, said determining means determines that the two signal lines are equivalent when the two logical functions are equivalent, and checks whether the first set of signal lines can be replaced by a set of input values so that output values of the two signal lines are different when the two logical functions are not equivalent, when the two logical functions are not equivalent, said signal line selecting means generates a second set of signal lines, including a signal line which is closer to the input terminal side than the first set of signal lines and affects two or more signal lines in the first set of signal lines, said logical function generating means generates a logical function of the first set of signal lines, using the second set of signal lines as a pseudo-input and the first set of signal lines as a pseudo-output, and said determining means checks, using the logical function of the first set of signal lines and the two logical functions, whether output values of the two signal lines can be different from each other.

12. A computer-readable storage medium for use with a computer for verifying equivalence of two logic circuits and outputting a verification result, comprising:

means for selecting an internal signal line, which is positioned closer to an input terminal than two signal lines extracted for comparison respectively from the two logic circuits and which affects both of the two signal lines;

means for generating a first set of signal lines including the selected signal line;

means for generating respective logical functions of the two signal lines according to the circuit information about a plurality of logic elements forming the two logic circuits and the first set of signal lines;

means for determining whether the two signal lines are equivalent from the generated logical functions; and means for verifying the functional equivalence of the two logic circuits based on a determination result, wherein said logical function generating means computes the two respective logical functions using the first set of signal lines as a pseudo-input and the two signal lines as a pseudo-output, said determining means determines that the two signal lines are equivalent when the two logical functions are equivalent, and checks whether the first set of signal lines can be replaced by a set of input values so that output values of the two signal lines are different when the two logical functions are not equivalent, when the two logical functions are not equivalent, said signal line selecting means generates a second set of signal lines, including a signal line which is closer to the input terminal side than the first set of signal lines and affects two or more signal lines in the first set of signal lines, said logical function generating means generates a logical function of the first set of signal lines, using the second set of signal lines as a pseudo-input and the first set of signal lines as a pseudo-output, and said determining means checks, using the logical function of the first set of signal lines and the two logical functions, whether output values of the two signal lines can be different from each other.

13. A logic circuit verifying method comprising the steps of:

selecting an internal signal line, which is positioned closer to an input terminal than two signal lines extracted for comparison respectively from two logic circuits and which affects both of the two signal lines;

generating a first set of signal lines including the selected signal line;

generating respective logical functions of the two signal lines according to the circuit information about a plurality of logic elements forming the two logic circuits and the first set of signal lines;

determining whether the two signal lines are equivalent from the generated logical functions; and verifying the functional equivalence of the two logic circuits based on a determination result, wherein said logical function generating step computes the two respective logical functions using the first set of signal lines as a pseudo-input and the two signal lines as a pseudo-output, said determining step determines that the two signal lines are equivalent when the two logical functions are equivalent, and checks whether the first set of signal lines can be replaced by a set of input values to that output values of the two signal lines are different when the two logical functions are not equivalent, when the two logical functions are not equivalent, said signal line selecting step generates a second set of signal lines, including a signal line which is closer to the input terminal side than the first set of signal lines and affects two or more signal lines in the first set of signal lines, said logical function generating step generates a logical function of the first set of signal lines, using the second set of signal lines as a pseudo-input and the first set of signal lines as a pseudo-output, and said determining step checks, using the logical function of the first set of signal lines and the two logical functions, whether output values of the two signal lines can be different from each other.

14. A method of verifying the equivalence of logic circuits, having circuit information, in an information processing machine, comprising the steps of:

retrieving two internal signal lines assumed to be equivalent;

selecting a signal line that affects the two internal signal lines and that is located closer to an input terminal than the two internal signal lines;

generating a first set of signal lines including the selected signal line; and generating a logical function of each of the two internal signal lines using the circuit information and the selected signal line, wherein said logical function generating step computes the logical functions using the first set of signal lines as a pseudo-input and the two internal signal lines as a pseudo-output, said determining step determines that the two internal signal lines are equivalent when the two logical functions are equivalent, and checks whether the first set of signal lines can be replaced by a set of input values so that output values of the two internal signal lines are different when the two logical functions are not equivalent, when the two logical functions are not equivalent, said signal line selecting step generates a second set of signal lines, including a signal line which is closer to the input terminal side than the first set of signal lines and affects two or more signal lines in the first set of signal lines, said logical function generating step generates a logical function of the first set of signal lines, using the second set of signal lines as a pseudo-input and the first set of signal lines as a pseudo-output, and a determination is made, using the logical function of the first set of signal lines and the two logical functions, whether output values of the two internal signal lines can be different from each other.

\* \* \* \* \*

UNITED STATES PATENT AND TRADEMARK OFFICE
CERTIFICATE OF CORRECTION

PATENT NO. : 5,909,374
DATED      : June 1, 1999
INVENTOR(S): Yusuke MATSUNAGA

It is certified that error appears in the above-identified patent and that said Letters Patent is hereby corrected as shown below:

On the title page: Item [56]
Ref. #9, "Uisng" should be --using--.

Col. 14, line 21, "traces" should be --trace,--;

Col. 14, line 39, "die" should be --the--;

Col. 15, line 32, "input" should be --output--.

Signed and Sealed this

Ninth Day of November, 1999

Attest:

Attesting Officer

Q. TODD DICKINSON

Acting Commissioner of Patents and Trademarks